(12) United States Patent
Shiga

(10) Patent No.: US 12,424,813 B2
(45) Date of Patent: Sep. 23, 2025

(54) LASER DEVICE, LASER CONTROL METHOD, AND ELECTRONIC DEVICE MANUFACTURING METHOD

(71) Applicant: Gigaphoton Inc., Tochigi (JP)

(72) Inventor: Takashi Shiga, Oyama (JP)

(73) Assignee: Gigaphoton Inc., Tochigi (JP)

( * ) Notice: Subject to any disclaimer, the term of this patent is extended or adjusted under 35 U.S.C. 154(b) by 111 days.

(21) Appl. No.: 18/505,716

(22) Filed: Nov. 9, 2023

(65) Prior Publication Data

US 2024/0072510 A1    Feb. 29, 2024

Related U.S. Application Data

(63) Continuation of application No. PCT/JP2021/023067, filed on Jun. 17, 2021.

(51) Int. Cl.
*H01S 3/13* (2006.01)
*G03F 7/00* (2006.01)
(Continued)

(52) U.S. Cl.
CPC ........ *H01S 3/1301* (2013.01); *G03F 7/70025* (2013.01); *G03F 7/7055* (2013.01);
(Continued)

(58) Field of Classification Search
CPC ............... G03F 7/70025; G03F 7/7055; H01S 3/08009; H01S 3/10069; H01S 3/1301;
(Continued)

(56) References Cited

U.S. PATENT DOCUMENTS 7,756,171 B2    7/2010 Jacques
2006/0239309 A1*  10/2006 Ariga .................... H01S 3/1301
                                                    372/55
(Continued)

FOREIGN PATENT DOCUMENTS

JP    H11-214782 A    8/1999
JP    2000-188439 A    7/2000
(Continued)

OTHER PUBLICATIONS

International Search Report issued in PCT/JP2021/023067; mailed Aug. 10, 2021.
(Continued)

*Primary Examiner* — Peter B Kim
(74) *Attorney, Agent, or Firm* — Studebaker Brackett PLLC

(57) ABSTRACT

A laser device includes a master oscillator configured to output pulse laser light at a first discharge timing synchronized with a repetition frequency; an amplifier configured to amplify the pulse laser light by exciting, with a charge voltage at a second discharge timing, a laser medium through which the pulse laser light passes; and a processor configured to provide a command on the charge voltage to the amplifier based on a charge voltage command value provided from an exposure apparatus, set the second discharge timing by adding a delay time to the first discharge timing, and perform a process of changing the delay time and a process of correcting the charge voltage command value in accordance with a change of the repetition frequency.

12 Claims, 10 Drawing Sheets

(51) Int. Cl.
*H01S 3/10* (2006.01)
*H01S 3/225* (2006.01)
*H01S 3/23* (2006.01)

(52) U.S. Cl.
CPC .......... *H01S 3/10069* (2013.01); *H01S 3/225* (2013.01); *H01S 3/2316* (2013.01)

(58) Field of Classification Search
CPC ........ H01S 3/1306; H01S 3/134; H01S 3/137; H01S 3/225; H01S 3/2316; H01S 3/2366
See application file for complete search history.

(56) References Cited

U.S. PATENT DOCUMENTS

| | | |
|---|---|---|
| 2018/0102622 A1 | 4/2018 | Kakizaki et al. |
| 2018/0309259 A1 | 10/2018 | Zhao et al. |
| 2019/0245321 A1 | 8/2019 | Kakizaki et al. |
| 2021/0226414 A1 | 7/2021 | Miura et al. |
| 2024/0079844 A1* | 3/2024 | Shiga .................. G03F 7/20 |

FOREIGN PATENT DOCUMENTS

| | | |
|---|---|---|
| JP | 2006-505960 A | 2/2006 |
| JP | 2019-505981 A | 2/2019 |
| WO | 2004/012308 A2 | 2/2004 |
| WO | 2017/009945 A1 | 1/2017 |
| WO | 2017/112060 A1 | 6/2017 |
| WO | 2018/105082 A1 | 6/2018 |
| WO | 2020/095418 A1 | 5/2020 |

OTHER PUBLICATIONS

International Search Report and Written Opinion issued in PCT/JP2021/023067; issued Dec. 14, 2023.

"Decision to Grant a Patent" Office Action issued in JP 2023-528886; mailed by the Japanese Patent Office on Mar. 28, 2025.

* cited by examiner

| RR | ΔD |
|---|---|
| RR1 | ΔD1 |
| RR2 | ΔD2 |
| ⋮ | |

LASER DEVICE, LASER CONTROL METHOD, AND ELECTRONIC DEVICE MANUFACTURING METHOD

CROSS-REFERENCE TO RELATED APPLICATIONS

The present application claims the benefit of International Application No. PCT/JP2021/023067, filed on Jun. 17, 2021, the entire contents of which are hereby incorporated by reference.

BACKGROUND

1. Technical Field

The present disclosure relates to a laser device, a laser control method, and an electronic device manufacturing method.

2. Related Art

Recently, in a semiconductor exposure apparatus, improvement in resolution has been desired for miniaturization and high integration of semiconductor integrated circuits. For this purpose, an exposure light source that outputs light having a shorter wavelength has been developed. For example, as a gas laser device for exposure, a KrF excimer laser device for outputting laser light having a wavelength of about 248 nm and an ArF excimer laser device for outputting laser light having a wavelength of about 193 nm are used.

The KrF excimer laser device and the ArF excimer laser device each have a large spectral line width of about 350 to 400 pm in natural oscillation light. Therefore, when a projection lens is formed of a material that transmits ultraviolet rays such as KrF laser light and ArF laser light, there is a case in which chromatic aberration occurs. As a result, the resolution may decrease. Then, a spectral line width of laser light output from the gas laser device needs to be narrowed to the extent that the chromatic aberration can be ignored. For this purpose, there is a case in which a line narrowing module (LNM) including a line narrowing element (etalon, grating, and the like) is provided in a laser resonator of the gas laser device to narrow a spectral line width. In the following, a gas laser device with a narrowed spectral line width is referred to as a line narrowing gas laser device.

LIST OF DOCUMENTS

Patent Documents

Patent Document 1: U.S. Pat. No. 7,756,171
Patent Document 2: US Patent Application Publication No. 2018/0309259

SUMMARY

A laser device according to an aspect of the present disclosure includes a master oscillator configured to output pulse laser light at a first discharge timing synchronized with a repetition frequency; an amplifier configured to amplify the pulse laser light by exciting, with a charge voltage at a second discharge timing, a laser medium through which the pulse laser light passes; and a processor configured to provide a command on the charge voltage to the amplifier based on a charge voltage command value provided from an exposure apparatus, set the second discharge timing by adding a delay time to the first discharge timing, and perform a process of changing the delay time and a process of correcting the charge voltage command value in accordance with a change of the repetition frequency.

A laser control method according to another aspect of the present disclosure includes outputting pulse laser light from a master oscillator at a first discharge timing synchronized with a repetition frequency; amplifying the pulse laser light by exciting, with a charge voltage at a second discharge timing obtained by adding a delay time to the first discharge timing, a laser medium of an amplifier through which the pulse laser light passes; providing a command on the charge voltage to the amplifier based on a charge voltage command value provided from an exposure apparatus; and performing a process of changing the delay time and a process of correcting the charge voltage command value in accordance with a change of the repetition frequency.

An electronic device manufacturing method according to another aspect of the present disclosure includes generating laser light using a laser device, outputting the laser light to an exposure apparatus, and exposing a photosensitive substrate to the laser light in the exposure apparatus to manufacture an electronic device. Here, the laser device includes a master oscillator configured to output pulse laser light at a first discharge timing synchronized with a repetition frequency; an amplifier configured to amplify the pulse laser light by exciting, with a charge voltage at a second discharge timing, a laser medium through which the pulse laser light passes; and a processor configured to provide a command on the charge voltage to the amplifier based on a charge voltage command value provided from an exposure apparatus, set the second discharge timing by adding a delay time to the first discharge timing, and perform a process of changing the delay time and a process of correcting the charge voltage command value in accordance with a change of the repetition frequency.

BRIEF DESCRIPTION OF THE DRAWINGS

Embodiments of the present disclosure will be described below merely as examples with reference to the accompanying drawings.

DESCRIPTION OF EMBODIMENTS

Contents

Figure 1:
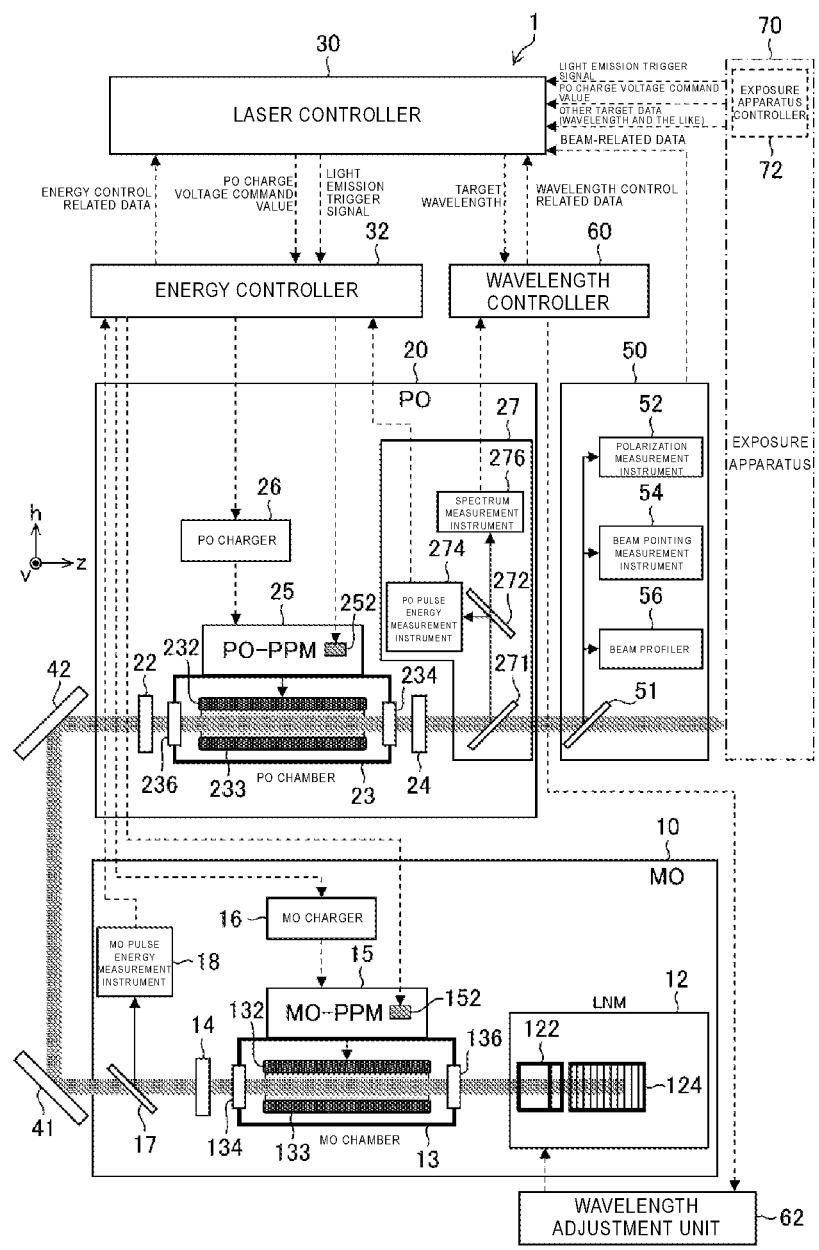
FIG. 1 schematically shows a configuration example of a laser device.

1. Overview of laser device
   1.1 Configuration
   1.2 Operation
   1.3 Characteristic of line narrowing laser
2. Problem
3. First embodiment
   3.1 Configuration
   3.2 Operation
   3.3 Effect
4. Second embodiment
   4.1 Configuration
   4.2 Operation
   4.3 Effect
5. Other application examples
6. Electronic device manufacturing method
7. Others Hereinafter, embodiments of the present disclosure will be described in detail with reference to the drawings. The embodiments described below show some examples of the present disclosure and do not limit the contents of the present disclosure. Also, all configurations and operation described in the embodiments are not necessarily essential as configurations and operation of the present disclosure. Here, the same components are denoted by the same reference numeral, and duplicate description thereof is omitted.

1. Overview of Laser Device 1.1 Configuration

FIG. 1 schematically shows a configuration example of a laser device 1. The laser device 1 is an excimer laser device including a master oscillator (MO) 10, a power oscillator (PO) 20, a laser controller 30, and an energy controller 32. The laser device 1 may include high reflection mirrors 41, 42, a beam measurement instrument 50, a wavelength controller 60, and a wavelength adjustment unit 62.

The master oscillator 10 includes a line narrowing module (LNM) 12, an MO chamber 13, an MO output coupling mirror 14, an MO pulse power module (PPM) 15, and an MO charger 16. The LNM 12 includes a prism 122 for narrowing the spectral line width and a grating 124. The grating 124 is arranged in the Littrow arrangement so that the incident angle and the diffraction angle coincide with each other.

The MO output coupling mirror 14 may be a partial reflection mirror having a reflectance of 20% to 30%. The MO output coupling mirror 14 is arranged to configure an optical resonator together with the LNM 12.

The MO chamber 13 is arranged on the optical path of the optical resonator. The MO chamber 13 includes a pair of discharge electrodes 132, 133 and two windows 134, 136 through which the laser light is transmitted. A laser gas is supplied from a gas supply device (not shown) into the MO chamber 13. The laser gas is an excimer laser gas including a rare gas, a halogen gas, and a buffer gas. The rare gas may be, for example, an argon (Ar) gas or a krypton (Kr) gas. The halogen gas may be, for example, a fluorine ($F_2$) gas. The buffer gas may be, for example, a neon (Ne) gas.

The MO pulse power module 15 includes a switch 152 and a charging capacitor (not shown), and is connected to the discharge electrode 132 via a feedthrough of an electrically insulating member (not shown). The discharge electrode 133 is connected to the MO chamber 13 that is grounded. The MO charger 16 charges the charging capacitor of the MO pulse power module 15 in accordance with a command from the energy controller 32.

The master oscillator 10 includes a beam splitter 17 and a MO pulse energy measurement instrument 18. The beam splitter 17 is arranged on the optical path of the laser light output from the MO output coupling mirror 14. The beam splitter 17 is arranged so that the reflection light of the beam splitter 17 enters the MO pulse energy measurement instrument 18. The MO pulse energy measurement instrument 18 includes a light concentrating lens (not shown) and an optical sensor (not shown). The optical sensor may be a fast-response photodiode that is resistant to ultraviolet light. A signal line for transmitting information obtained by the MO pulse energy measurement instrument 18 to the energy controller 32 is provided between the MO pulse energy measurement instrument 18 and the energy controller 32.

The pulse laser light transmitted through the beam splitter 17 is output from the master oscillator 10.

The high reflection mirror 41 and the high reflection mirror 42 are arranged on the optical path between the master oscillator 10 and the power oscillator 20 so that the laser light output from the master oscillator 10 enters the power oscillator 20.

The power oscillator 20 is an excimer amplifier that includes a rear mirror 22, a PO chamber 23, a PO output coupling mirror 24, a PO pulse power module 25, a PO charger 26, and a monitor module 27.

The rear mirror 22 and the PO output coupling mirror 24 configure an optical resonator, and the PO chamber 23 is arranged on the optical path of the optical resonator.

The configuration of the PO chamber 23 may be similar to that of the MO chamber 13. The PO chamber 23 includes a pair of discharge electrodes 232, 233 and two windows 234, 236. A laser gas is supplied into the PO chamber 23 in a similar manner as the MO chamber 13. The rear mirror 22 may be a partial reflection mirror having a reflectance of, for example, 80% to 90%. The PO output coupling mirror 24 may be a partial reflection mirror having a reflectance of 20% to 30%.

The PO pulse power module 25 includes a switch 252 and a charging capacitor (not shown), and is connected to the discharge electrode 232 via a feedthrough of an electrically insulating member (not shown). The discharge electrode 233 is connected to the PO chamber 23 that is grounded. The PO charger 26 charges the charging capacitor of the PO pulse power module 25 in accordance with a command from the energy controller 32.

In FIG. 1, the optical path axis direction of the laser light output from the power oscillator 20 is a z direction. The two directions substantially orthogonal to the z direction may be an h direction and a v direction. The v direction is a direction substantially orthogonal to the plane of FIG. 1. The discharge electrodes 232, 233 are arranged to face each other in the h direction.

The monitor module 27 includes beam splitters 271, 272, a PO pulse energy measurement instrument 274, and a spectrum measurement instrument 276.

The beam splitter 271 is arranged on the optical path of the pulse laser light output from PO output coupling mirror 24. The beam splitter 272 is arranged on the optical path of the pulse laser light reflected by the beam splitter 271. The beam splitter 272 is arranged such that the reflection light of the beam splitter 272 enters the PO pulse energy measurement instrument 274 and the transmission light of the beam splitter 272 enters the spectrum measurement instrument 276. The configuration of the PO pulse energy measurement instrument 274 may be similar to that of the MO pulse energy measurement instrument 18.

A signal line for transmitting information obtained by the PO pulse energy measurement instrument 274 to the energy controller 32 is provided between the PO pulse energy measurement instrument 274 and the energy controller 32.

The spectrum measurement instrument 276 may be, for example, an etalon spectrometer including an etalon (not shown), a light concentrating lens (not shown), and an image sensor (not shown). The interference fringes generated by the light concentrating lens on a focal plane thereof due to transmission through the etalon are measured using an image sensor. A signal line for transmitting information obtained by the spectrum measurement instrument 276 to the wavelength controller 60 is provided between the spectrum measurement instrument 276 and the wavelength controller 60.

The beam measurement instrument 50 includes a beam splitter 51, a polarization measurement instrument 52, a beam pointing measurement instrument 54, and a beam profiler 56. The beam splitter 51 is arranged on the optical path of the pulse laser light transmitted through the beam splitter 271 of the monitor module 27.

The beam splitter 51 is arranged such that the reflection light of the beam splitter 51 enters each of the polarization measurement instrument 52, the beam pointing measurement instrument 54, and the beam profiler 56 via an optical element (not shown), and the transmission light of the beam splitter 51 enters an exposure apparatus 70. A signal line for transmitting beam-related data obtained by the beam measurement instrument 50 to the laser controller 30 is provided between the beam measurement instrument 50 and the laser controller 30.

The laser controller 30 is operationally connected to the energy controller 32 and the wavelength controller 60. The energy controller 32 is operationally connected to the master oscillator 10 and the power oscillator 20. The energy controller 32 transmits charge voltage data to the MO charger 16 based on the pulse energy detected by the MO pulse energy measurement instrument 18, and controls the voltage to be charged to the charging capacitor of the MO pulse power module 15. Further, the energy controller 32 transmits charge voltage data to the PO charger 26 based on the pulse energy detected by the PO pulse energy measurement instrument 274, and controls the voltage to be charged to the charging capacitor of the PO pulse power module 25.

The wavelength controller 60 generates wavelength control related data based on the data obtained by the spectrum measurement instrument 276, and transmits the wavelength control related data to the laser controller 30. The wavelength controller 60 is operationally connected to the wavelength adjustment unit 62. The wavelength adjustment unit 62 includes, for example, a rotation drive mechanism such as a rotation stage that rotates the prism 122 of the LNM 12. The wavelength adjustment unit 62 is controlled based on the wavelength measured by the spectrum measurement instrument 276.

Further, the laser controller 30 is operationally connected to the beam measurement instrument 50 and the exposure apparatus 70. The exposure apparatus 70 includes an exposure apparatus controller 72.

Each of the laser controller 30, the energy controller 32, the wavelength controller 60, the exposure apparatus controller 72, and other controllers is configured by using at least one processor. The processor of the present disclosure is a processing device including a storage device in which a control program is stored and a central processing unit (CPU) that executes the control program. The processor is specifically configured or programmed to perform various processes included in the present disclosure. The processor may include an integrated circuit such as a field programmable gate array (FPGA) or an application specific integrated circuit (ASIC).

Each of the laser controller 30, the energy controller 32, and the wavelength controller 60 may be realized by a separate processor, or the processing functions of a plurality of controllers may be realized by a single processor.

1.2 Operation

The laser controller 30 receives a light emission trigger signal, a PO charge voltage command value, and other target data from the exposure apparatus 70. The laser controller 30 outputs the light emission trigger signal and the PO charge voltage command value to the energy controller 32.

The energy controller 32 outputs a first trigger signal synchronized with the light emission trigger signal and an MO charge voltage command value to the master oscillator 10. The first trigger signal is a signal that defines the MO charge timing. The MO charge voltage may be the same as the PO charge voltage or may be different from the PO charge voltage.

The master oscillator 10 may output seed laser light in synchronization with the first trigger signal. The seed laser light output from the master oscillator 10 is line narrowed.

The seed laser light output from the master oscillator 10 may enter the power oscillator 20 via the high reflection mirrors 41, 42.

The energy controller 32 outputs a second trigger signal synchronized with the light emission trigger signal and the PO charge voltage to the power oscillator 20. The second trigger signal is generated to have a delay time with respect to the first trigger signal. The second trigger signal is a signal that defines the PO discharge timing. The PO discharge timing is a timing obtained by adding the delay time to MO discharge timing. The power oscillator 20 may form a discharge region in synchronization with the second trigger signal. The seed laser light having entered the power oscillator 20 is amplified by passing through the discharge region of the PO chamber 23. The power oscillator 20 may amplify the entered seed laser light at the discharge region and output output laser light.

1.3 Characteristic of Line Narrowing Laser

Figure 2:
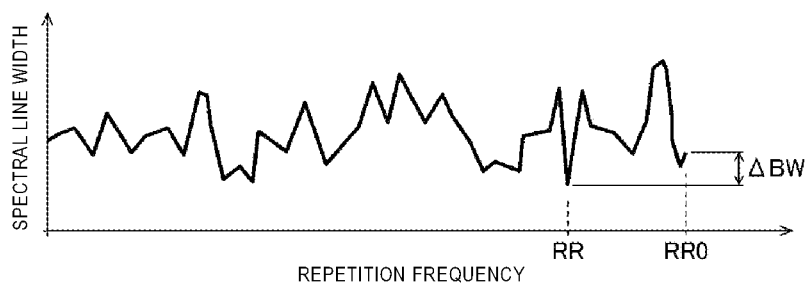
FIG. 2 is an example of a graph showing the relationship between the repetition frequency and the spectral line width.

The characteristics of the output laser light output from the power oscillator 20 varies depending on the repetition frequency. FIG. 2 is an example of a graph showing the relationship between the repetition frequency and the spectral line width. For example, as shown in FIG. 2, the spectral line width varies in a complex manner with respect to the repetition frequency. Therefore, when the repetition frequency changes from a nominal value RR0 to a certain value RR, the spectral line width changes by ΔBW. Further, the characteristics of the output laser light output from the power oscillator 20 varies depending on a delay time D between the MO discharge timing and the PO discharge timing.

Figure 3:
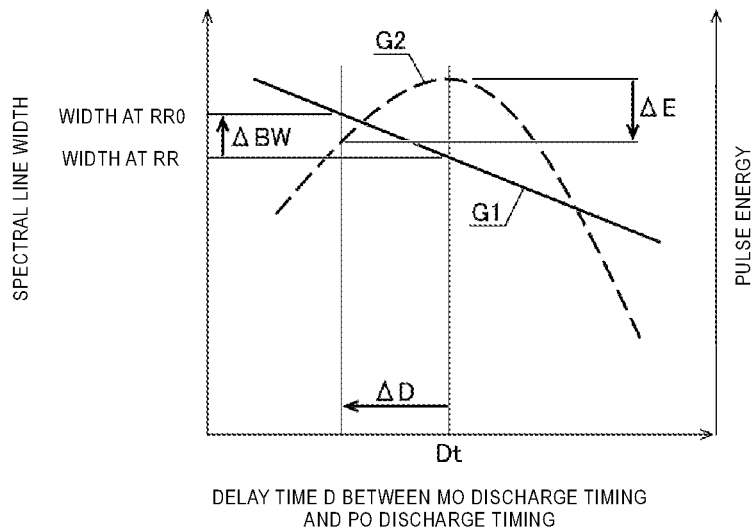
FIG. 3 is an example of a graph showing the relationship between a delay time, between a master oscillator (MO) discharge timing and a power oscillator (PO) discharge timing, and each of the spectral line width and the pulse energy.

FIG. 3 is an example of a graph showing the relationship between the delay time D, between the MO discharge timing and the PO discharge timing, and the spectral line width and the pulse energy. In FIG. 3, the horizontal axis represents the delay time D, the vertical axis on the left of FIG. 3 represents the spectral line width, and the vertical axis on the right represents the pulse energy. A graph G1 indicated by a solid line in FIG. 3 shows the relationship between the delay time D and the spectral line width. A graph G2 indicated by a broken line in FIG. 3 shows the relationship between the delay time D and the pulse energy. As shown in FIG. 3, for example, the spectral line width decreases as the delay time D increases. The pulse energy has a maximal value with respect to the delay time D. The laser device 1 operates with the delay time D that takes the maximal value as a nominal value Dt. When the repetition frequency is RR0, the delay time D is set to Dt. The nominal value Dt of the delay time D may be referred to as the "nominal delay time Dt".

When the repetition frequency is changed from RR0 to RR, the laser controller 30 corrects the change amount ΔBW of the spectral line width that occurs when the repetition frequency is changed, using the characteristic shown in FIG. 3. Here, FIG. 3 shows the characteristic after the repetition frequency is changed from RR0 to RR. Therefore, the spectral line width corresponding to the delay time Dt is the width when the repetition frequency is RR. That is, ΔBW at a certain repetition frequency RR can be found from the characteristic shown in FIG. 2. Further, from the characteristic shown in FIG. 3, it can be seen that the delay time D may be changed from the nominal value Dt by the change amount ΔD to cancel ΔBW or cause ΔBW to be reduced. The change amount ΔD of the delay time D may be referred to as the "delay time change amount ΔD."

Figures 4, 5:
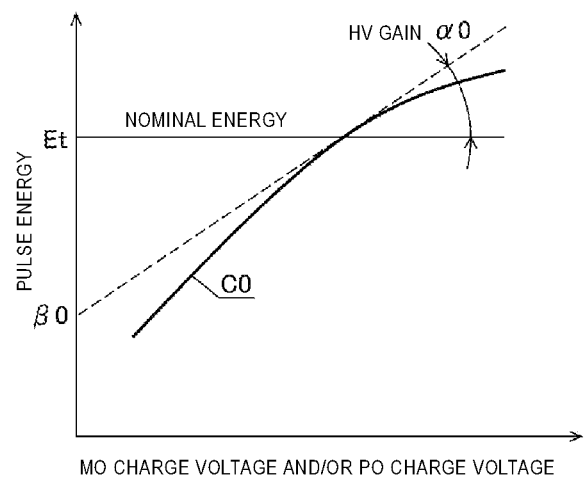
FIG. 4 is an example of a table that defines the correspondence relationship between the repetition frequency and a delay time change amount.
FIG. 5 is an example of a graph showing the relationship between an MO charge voltage and/or a PO charge voltage and the pulse energy and shows an example of a HV gain and an offset determined from linear function approximation.

As a result, as shown in FIG. 4, a table is obtained in which the repetition frequency RR and the delay time change amount ΔD are associated with each other. The laser device 1 holds the data of this table.

On the other hand, the characteristics of the output laser light is also changed by the MO charge voltage and/or the PO charge voltage, and the pulse energy shows the characteristic as shown by a graph of a curve C0 in FIG. 5. The characteristic shown in FIG. 5 is used to stabilize the pulse energy. For example, when the laser light is output to the exposure apparatus 70, the pulse energy is feedback controlled and stabilized within a target range by adjusting the MO charge voltage and/or the PO charge voltage. This is referred to as HV control. As parameters of the feedback control, a "HV gain" and an "offset" may be used.

When the pulse energy Ep of the laser device 1 can be approximated as a linear function of the charge voltage command value HV as in the following expression (1), the slope α is referred to as the HV gain, and the intercept β is referred to as the offset.

$$Ep = \alpha HV + \beta \quad (1)$$

In FIG. 3, when the delay time D is changed by ΔD to maintain the spectral line width in response to a change in the repetition frequency from RR0 to RR, the pulse energy is fluctuated by ΔE. The HV control serves to compensate this energy fluctuation. The energy controller 32 performs feedback control of the PO charge voltage based on the measurement result of the PO pulse energy measurement instrument 274.

2. Problem

In the laser device 1, the HV gain and the offset in the operation region are calculated by approximating the characteristic of the pulse energy as shown in FIG. 5 by a linear function. FIG. 5 shows an example in which the HV gain α0 is calculated from the slope of the tangent at the nominal energy value Et in the characteristic curve C0 of the pulse energy. The intercept of this tangent is the offset α0. In the HV control, the charge voltage based on the HV gain and the offset is output so that the pulse energy becomes constant (becomes a value within a target range).

Figure 6:
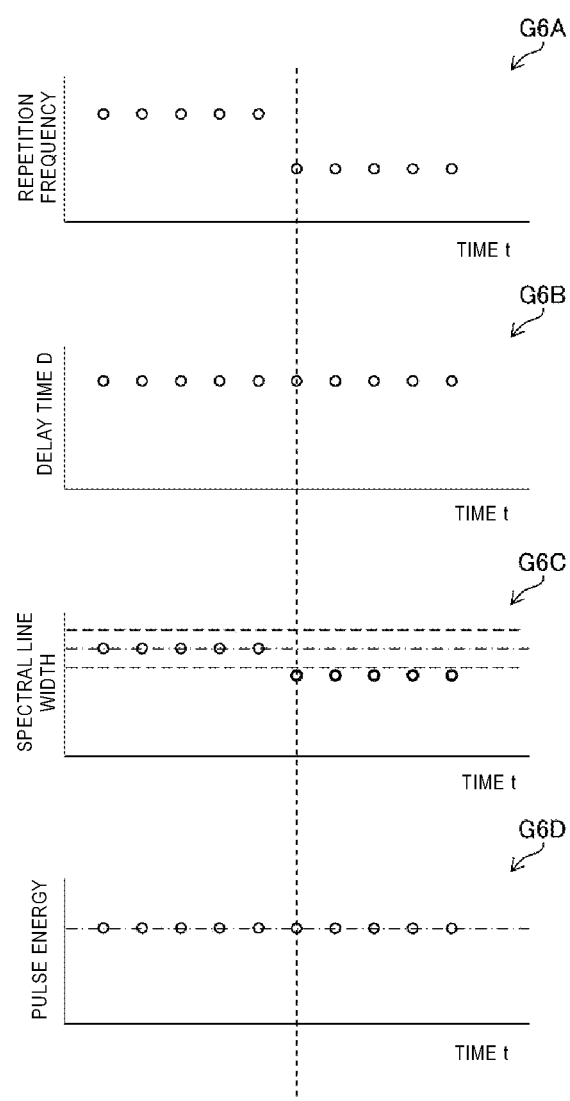
FIG. 6 is an example of graphs showing the laser operation when the control of a first comparative example is applied.

On the other hand, there is a case in which the exposure apparatus 70 instructs the laser device 1 to switch the repetition frequency (see FIG. 6). FIG. 6 is an example of graphs showing the laser operation when the control of a first comparative example is applied. The comparative example of the present disclosure is an example recognized by the applicant as known only by the applicant, and is not a publicly known example admitted by the applicant.

In FIG. 6, graphs G6A to G6D showing the transition of the values of the repetition frequency, the delay time D, the spectral line width, and the pulse energy are shown from the top with a common time axis.

When the repetition frequency is changed by a command from the exposure apparatus 70, rapid fluctuation of the spectral line width may occur in accordance with the switching of the repetition frequency due to the characteristic shown in FIG. 2 (graph G6C in FIG. 6). To suppress the fluctuation of the spectral line width, the delay time D between the MO discharge timing and the PO discharge timing may be changed from the nominal value Dt by using the characteristic shown in FIG. 3.

Figure 7:
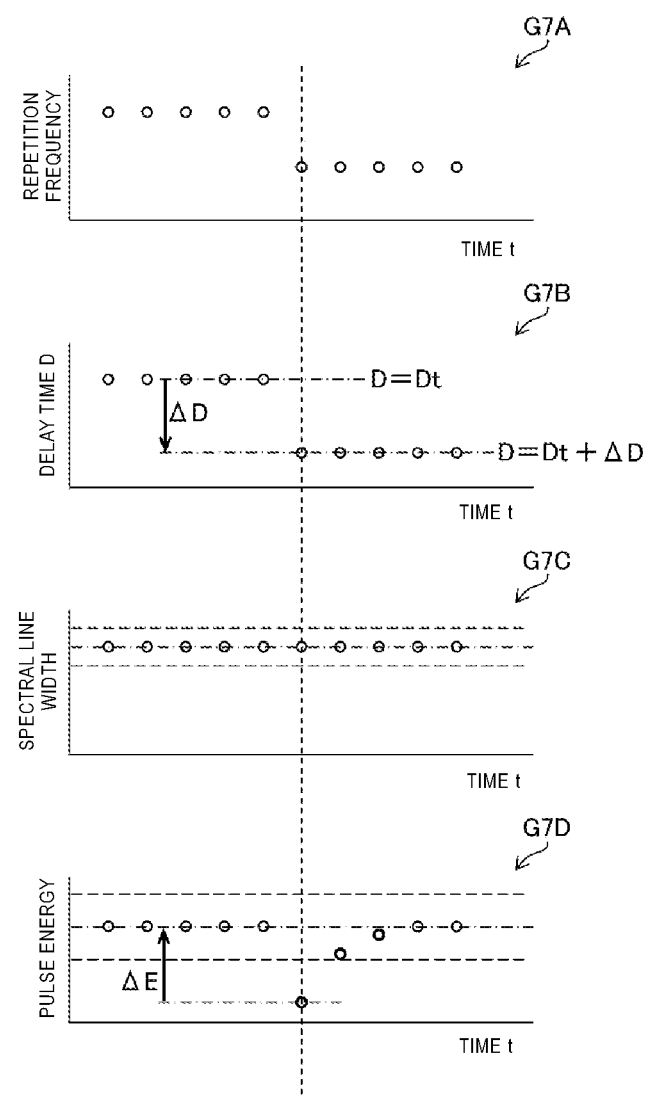
FIG. 7 is an example of graphs showing the laser operation when the control of a second comparative example including fluctuation suppression control of the spectral line width using the characteristic shown in FIG. 3 is applied.

FIG. 7 is an example of graphs showing the laser operation when the control of a second comparative example including fluctuation suppression control of the spectral line width using the characteristic shown in FIG. 3 is applied. In FIG. 7, similarly to FIG. 6, graphs G7A to G7D showing the transition of the values of the repetition frequency, the delay time D, the spectral line width, and the pulse energy are shown from the top with a common time axis.

To suppress rapid fluctuation of the spectral line width due to the switching of the repetition frequency, the control is performed to change the delay time D from the nominal value Dt by ΔD in accordance with the change of the repetition frequency, as shown in graph G7B. As a result, as shown in graph G7C, the spectral line width can fall within a predetermined allowable range even after the switching of the repetition frequency.

However, when the delay time D between the MO discharge timing and the PO discharge timing is changed (see graph G7B), the pulse energy fluctuates due to the characteristic shown in FIG. 3. At the same time, the characteristic shown in FIG. 5 also changes in accordance with the delay time D, and the HV gain and the offset to be used for the HV control change (see FIGS. 8 and 9).

Figure 8:
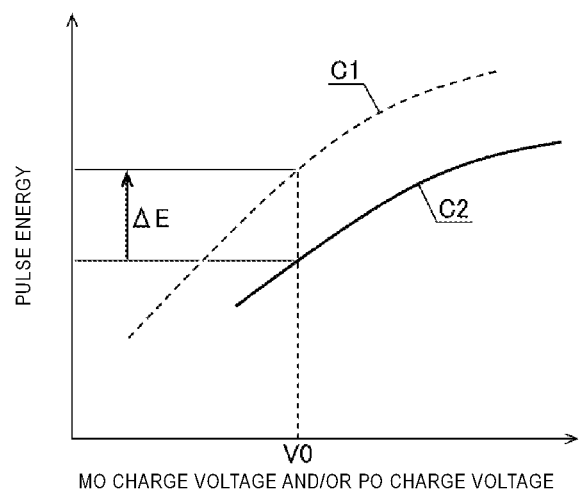
FIG. 8 is an example of a graph showing the relationship between the MO charge voltage and/or the PO charge voltage and the pulse energy, and shows an example of the characteristic change due to the change of the delay time.
Figure 9:
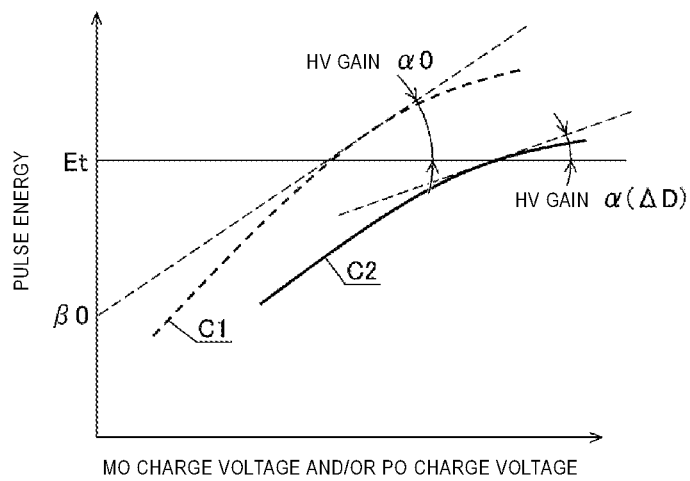
FIG. 9 is an example of a graph showing the relationship between the MO charge voltage and/or the PO charge voltage and the pulse energy, and shows an example in which the HV gain and the offset change with the change of the delay time.

A characteristic curve C1 indicated by a broken line in FIG. 8 is an example of the characteristic when the delay time D is a nominal value Dt, and a characteristic curve C2 indicated by a solid line is an example of the characteristic when the delay time D is Dt+ΔD. For example, in the case of FIG. 8, it is assumed that the HV control operates so that the pulse energy falls within the target range at the delay time D being Dt and that the PO charge voltage reaches V0. Here, when the delay time D is changed from Dt to Dt+ΔD, the pulse energy decreases due to the characteristic shown in FIG. 3, and the pulse energy at the PO charge voltage V0 decreases by ΔE and may deviate from the target range (see graph G7D in FIG. 7).

To compensate for the decrease amount ΔE of the pulse energy due to the change of the delay time D described above, the HV control is operated again, and the HV gain α0 and the offset β0 at the delay time D being Dt are also used in this HV control.

On the other hand, when the delay time D is changed to Dt+ΔD, the HV gain and the offset of the laser device 1 change (see FIG. 9), which causes mismatch with the HV gain and the offset used in the HV control. This mismatch can result in excessive HV control response and unstable pulse energy control. Alternatively, the response of the HV control may become insufficient and more pulses may be required until the control of the pulse energy settles within the target range.

As a result, when the delay time D is changed, the control of the pulse energy becomes unstable, and the pulse energy may deviate from the target range (graph G7D in FIG. 7).

As described above, when the repetition frequency is switched in response to an instruction from the exposure apparatus 70, the HV control may become unstable.

3. First Embodiment

3.1 Configuration

Figure 10:
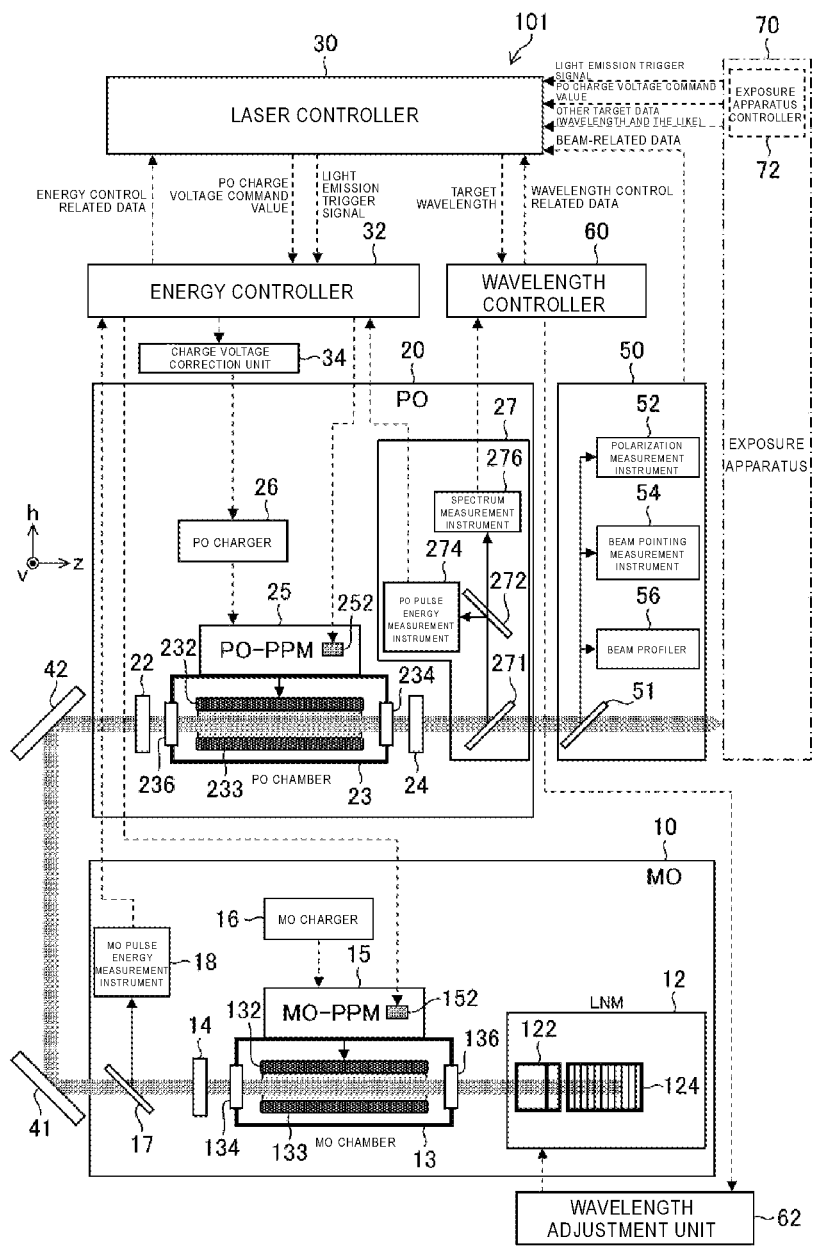
FIG. 10 schematically shows a configuration example of the laser device according to a first embodiment.

FIG. 10 schematically shows the configuration of a laser device 101 according to a first embodiment. The configuration shown in FIG. 10 will be described in terms of differences from the configuration shown in FIG. 1.

The laser device 101 shown in FIG. 10 includes a charge voltage correction unit 34 between the energy controller 32 and the PO charger 26. The charge voltage correction unit 34 may be configured by software, or may be implemented as a part of the function of the energy controller 32. Alternatively, the charge voltage correction unit 34 may be configured by using a processor different from the energy controller 32.

Figures 11, 12:
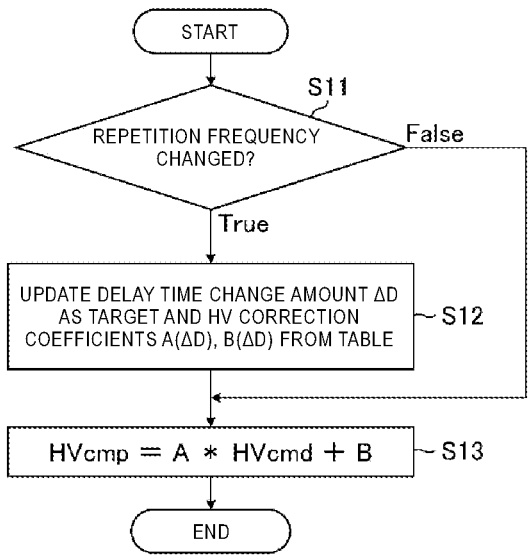
FIG. 11 is an example of a table that defines the correspondence relationship among the repetition frequency, the delay time change amount, and HV correction coefficients.
FIG. 12 is a flowchart showing a control example of the PO charge voltage of the laser device according to the first embodiment.

The laser device 101 has a table as shown in FIG. 11 in which HV correction coefficients A(ΔD), B(ΔD), which are functions of the delay time change amount ΔD, are added to the table described with reference to FIG. 4.

The HV correction coefficient A(ΔD) and the HV correction coefficient B(ΔD) are calculated based on, for example, the following expressions (2) and (3), respectively.

$$A(\Delta D)=\alpha 0/\alpha(\Delta D) \quad (2)$$

$$B(\Delta D)=(\beta 0-\beta(\Delta D))/\alpha(\Delta D) \quad (3)$$

In the expressions, α0 and α0 are the HV gain and the offset when the delay time D is the nominal value Dt (i.e., ΔD=0). Further, α(ΔD) and β(ΔD) are the HV gain and the offset being functions of the delay time change amount ΔD.

3.2 Operation

The energy controller 32 determines the delay time change amount ΔD and the HV correction coefficients A(ΔD), B(ΔD) corresponding to ΔD in accordance with a change in operation conditions such as the switching of the repetition frequency (FIG. 12). The charge voltage correction unit 34 calculates a charge voltage correction value HVcmp from a charge voltage command value HVcmd received from the exposure apparatus 70 and the HV correction coefficients A(ΔD), B(ΔD) by the following expression (4).

$$HVcmp=A(\Delta D)*HVcmd+B(\Delta D) \quad (4)$$

Then, the charge voltage correction unit 34 outputs the charge voltage correction value HVcmp as a command value for providing a command on the PO charge voltage. The charging capacitor of the PO pulse power module 25 is charged by the PO charger 26, and the laser gas in the PO chamber 23 is excited by the PO charge voltage corresponding to the charge voltage correction value HVcmp. As a result, the pulse laser light amplified to the pulse energy corresponding to the PO charge voltage is output from the power oscillator 20.

The power oscillator 20 is an example of the "amplifier" in the present disclosure, and the laser gas contained in the PO chamber 23 is an example of the "laser medium" in the present disclosure. The MO discharge timing is an example of the "first discharge timing" in the present disclosure. The PO discharge timing is an example of the "second discharge timing" in the present disclosure. Regarding the repetition frequency, RR0 is an example of the "first repetition frequency" in the present disclosure, and RR is an example of the "second repetition frequency" in the present disclosure. The nominal delay time Dt set when the repetition frequency is RR0 is an example of the "first delay time" in the present disclosure. The HV correction coefficients A(ΔD), B(ΔD) used for the correction process performed by the charge voltage correction unit 34 are examples of the "correction coefficient" in the present disclosure. The HV correction coefficient A(ΔD) multiplied by the charge voltage command value HVcmd is an example of the "first correction coefficient" in the present disclosure, and the HV correction coefficient B(ΔD) added to the product of HVcmd and A(ΔD) is an example of the "second correction coefficient" in the present disclosure.

FIG. 12 is a flowchart showing a control example of the laser device 101 according to the first embodiment. The flowchart of FIG. 12 can be realized by the processor functioning as the energy controller 32 and/or the charge voltage correction unit 34 executing a program.

In step S11, the energy controller 32 determines whether or not the repetition frequency is changed. When the repetition frequency is changed and the determination result in step S11 is True determination, processing proceeds to step S12.

In step S12, the energy controller 32 updates the delay time change amount ΔD as the target value of the change of the delay time D and the HV correction coefficients A(ΔD), B(ΔD) based on the table (FIG. 11). After step S12, processing proceeds to step S13.

In the determination of step S11, when the repetition frequency is not changed and the determination result in step S11 is False determination, the energy controller 32 and the charge voltage correction unit 34 skip step S12 and processing proceeds to step S13.

Then, in step S13, the charge voltage correction unit 34 obtains the charge voltage correction value HVcmp in accordance with the expression (4), and outputs the calculated charge voltage correction value HVcmp to the PO charger 26 as the command value for providing the command on the PO charge voltage.

After step S13, the energy controller 32 and the charge voltage correction unit 34 end the flowchart of FIG. 12.

The energy controller 32 and the charge voltage correction unit 34 may repeatedly execute the processing of the flowchart of FIG. 12 for each pulse.

The laser control method including the processing according to the flowchart of FIG. 12 is an example of the "laser control method" in the present disclosure.

3.3 Effect

When the laser device 101 according to the first embodiment is operated with the delay time change amount $\Delta D$, the pulse energy Ep is approximated by the following expression.

$$\begin{aligned} Ep &= \alpha(\Delta D)HV_{cmp} + \beta(\Delta D) \quad \text{[Numerical expression 1]} \\ &= \alpha(\Delta D)\{A(\Delta D)HV_{cmd} + B(\Delta D)\} + \beta(\Delta D) \\ &= \alpha(\Delta D)\left\{\frac{\alpha_0}{\alpha(\Delta D)}HV_{cmd} + \frac{\beta_0 - \beta(\Delta D)}{\alpha(\Delta D)}\right\} + \\ &\quad \beta(\Delta D) \\ &= \alpha_0 HV_{cmd} + \beta_0 \end{aligned}$$

That is, apparently from the exposure apparatus 70, the HV gain and the offset with respect to the charge voltage command value HVcmd become the nominal values $\alpha 0$, $\beta 0$, respectively, and the fluctuation due to the change of the delay time change amount $\Delta D$ is suppressed. As a result, even when the repetition frequency is switched in response to an instruction from the exposure apparatus 70, the HV control is suppressed from becoming unstable.

4. Second Embodiment

4.1 Configuration

Figure 13:
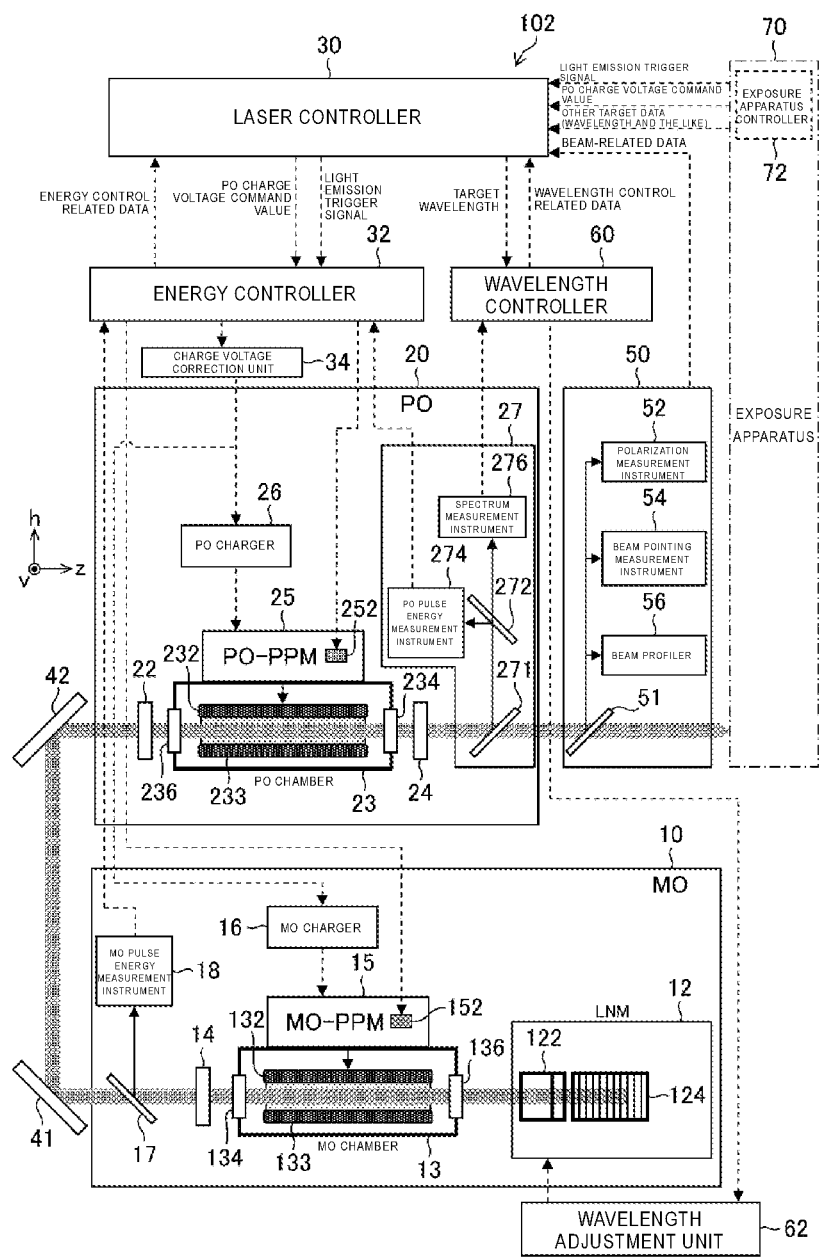
FIG. 13 schematically shows a configuration example of the laser device according to a second embodiment.

FIG. 13 schematically shows the configuration of a laser device 102 according to a second embodiment. The configuration of FIG. 13 will be described in terms of differences from the configuration of FIG. 10. The MO charge voltage in the laser device 102 according to the second embodiment is the same as the PO charge voltage. A signal line for transmitting a command on the MO charge voltage equal to the PO charge voltage from the charge voltage correction unit 34 to the MO charger 16 is provided between the charge voltage correction unit 34 and the MO charger 16. Other configurations are similar to those of the laser device 101 according to the first embodiment.

However, since the MO charge voltage is different from that in the first embodiment, the value of the device parameter may be different from that in the first embodiment. For example, the numerical values of $\alpha 0$ and $\alpha 0$ may be different from those of the first embodiment. Similarly, the values of $\alpha(\Delta D)$, $\beta(\Delta D)$, $A(\Delta D)$, and $B(\Delta D)$ may also be different from those in the first embodiment.

4.2 Operation

The operation of the laser device 102 according to the second embodiment will be described in terms of differences from the laser device 101 according to the first embodiment. In the second embodiment, the charge voltage correction unit 34 outputs the charge voltage correction value Hvcmp as the PO charge voltage and the MO charge voltage. Other operation is similar to that in the first embodiment.

4.3 Effect

According to the laser device 102 of the second embodiment, similar effects to those of the first embodiment can be obtained.

5. Other Application Examples

In the first and second embodiments described above, the change of the repetition frequency has been described as an example, but the present invention is not limited thereto, and other operation conditions may be changed. Further, the spectral line width is an example of the characteristics of the laser light, and the delay time D may be changed to suppress fluctuation of other characteristics. The technique of laser control according to the present disclosure can be applied to control of "reducing characteristic variation (fluctuation) of laser light by changing the delay time D in accordance with the operation conditions." When the delay time D is changed in accordance with the change of the operation condition, by correcting the charge voltage, it is possible to suppress the deviation from the target range of the characteristics of the laser light.

6. Electronic Device Manufacturing Method

Figure 14:
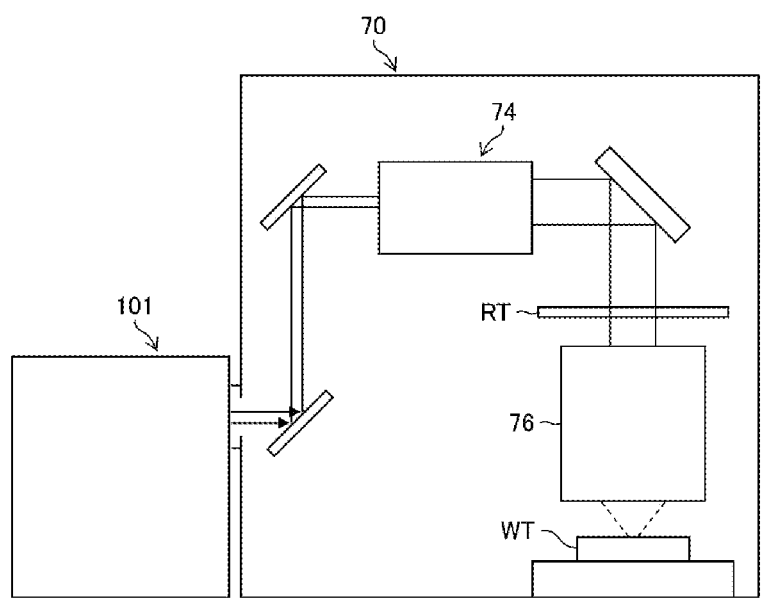
FIG. 14 schematically shows a configuration example of an exposure apparatus.

FIG. 14 schematically shows a configuration example of the exposure apparatus 70. The exposure apparatus 70 includes an illumination optical system 74 and a projection optical system 76. The illumination optical system 74 illuminates a reticle pattern of a reticle (not shown) arranged on a reticle stage RT with laser light incident from the laser device 101. The projection optical system 76 causes the laser light transmitted through the reticle to be imaged as being reduced and projected on a workpiece (not shown) arranged on a workpiece table WT. The workpiece is a photosensitive substrate such as a semiconductor wafer on which photoresist is applied.

The exposure apparatus 70 synchronously translates the reticle stage RT and the workpiece table WT to expose the workpiece to the laser light reflecting the reticle pattern. After the reticle pattern is transferred onto the semiconductor wafer by the exposure process described above, a semiconductor device can be manufactured through a plurality of processes. The semiconductor device is an example of the "electronic device" in the present disclosure. Instead of the laser device 101, the laser device 102 may be used.

7. Others

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious to those skilled in the art that embodiments of the present disclosure would be appropriately combined.

The terms used throughout the present specification and the appended claims should be interpreted as non-limiting terms unless clearly described. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of any thereof and any other than A, B, and C.

What is claimed is:

1. A laser device comprising:
a master oscillator configured to output pulse laser light at a first discharge timing synchronized with a repetition frequency;
an amplifier configured to amplify the pulse laser light by exciting, with a charge voltage at a second discharge timing, a laser medium through which the pulse laser light passes; and
a processor configured to provide a command on the charge voltage to the amplifier based on a charge voltage command value provided from an exposure apparatus, set the second discharge timing by adding a delay time to the first discharge timing, and perform a process of changing the delay time and a process of correcting the charge voltage command value in accordance with a change of the repetition frequency.

2. The laser device according to claim 1,
wherein the processor performs the process of changing the delay time and the process of correcting the charge voltage command value using a table in which the repetition frequency, the delay time, and a correction coefficient used for correcting the charge voltage command value are associated with each other.

3. The laser device according to claim 1,
wherein the processor stores a table in which the repetition frequency, a change amount of the delay time, and a correction coefficient used for correcting the charge voltage command value are associated with each other, determines the change amount and the correction coefficient based on the table in accordance with the change of the repetition frequency, calculates a charge voltage correction value from the determined correction coefficient and the charge voltage command value, and outputs the charge voltage correction value as a command value for providing a command on the charge voltage of the amplifier.

4. The laser device according to claim 3,
wherein the correction coefficient includes a first correction coefficient by which the charge voltage command value is to be multiplied and a second correction coefficient to be added to a product of the charge voltage command value and the first correction coefficient.

5. The laser device according to claim 1,
wherein a first correction coefficient and a second correction coefficient are used in the process of correcting the charge voltage command value,
each of the first correction coefficient and the second correction coefficient is a function of a change amount of the delay time, and the processor corrects the charge voltage command value to determine a charge voltage correction value by an expression of $HVcmp=A(\Delta D)*HVcmd+B(\Delta D)$, where $\Delta D$ is the change amount, $A(\Delta D)$ is the first correction coefficient, $B(\Delta D)$ is the second correction coefficient, HVcmd is the charge voltage command value provided from the exposure apparatus, and HVcmp is the charge voltage correction value obtained by the correction.

6. The laser device according to claim 5,
wherein the delay time when the repetition frequency is a first repetition frequency is set to a first delay time, and
the first correction coefficient and the second correction coefficient are determined respectively by expressions of $A(\Delta D)=\alpha 0/\alpha(\Delta D)$ and $B(\alpha D)=(\alpha 0-\alpha(\Delta D))/\alpha(\Delta D)$, where a slope and an intercept of a linear function are referred to as a gain and an offset respectively when a pulse energy of output laser light output from the amplifier is approximated by the linear function with respect to a command value for providing a command on the charge voltage, the gain and the offset at the first delay time are $\alpha 0$ and $\beta 0$ respectively, the change amount when the repetition frequency is changed from the first repetition frequency to a second repetition frequency is $\Delta D$, and the gain and the offset which are functions of the change amount are $\alpha(\Delta D)$ and $\beta(\Delta D)$ respectively.

7. The laser device according to claim 1,
wherein the processor also provides a command on the charge voltage to the master oscillator.

8. The laser device according to claim 1,
wherein the processor changes the delay time to suppress spectral line width fluctuation due to the change of the repetition frequency, and corrects the charge voltage command value to suppress pulse energy fluctuation due to the change of the delay time.

9. The laser device according to claim 1,
further comprising a pulse energy measurement instrument configured to measure a pulse energy of output laser light output from the amplifier,
wherein the processor provides a command on the charge voltage based on a measurement result of the pulse energy measurement instrument so that the pulse energy measured by using the pulse energy measurement instrument falls within a target range.

10. The laser device according to claim 1,
wherein the amplifier includes a chamber in which an excimer laser gas including a rare gas, a halogen gas, and a buffer gas as the laser medium is contained.

11. A laser control method comprising:
outputting pulse laser light from a master oscillator at a first discharge timing synchronized with a repetition frequency;
amplifying the pulse laser light by exciting, with a charge voltage at a second discharge timing obtained by adding a delay time to the first discharge timing, a laser medium of an amplifier through which the pulse laser light passes;
providing a command on the charge voltage to the amplifier based on a charge voltage command value provided from an exposure apparatus; and
performing a process of changing the delay time and a process of correcting the charge voltage command value in accordance with a change of the repetition frequency.

12. An electronic device manufacturing method, comprising:
- generating laser light using a laser device;
- outputting the laser light to an exposure apparatus; and
- exposing a photosensitive substrate to the laser light in the exposure apparatus to manufacture an electronic device,
- the laser device including:
- a master oscillator configured to output pulse laser light at a first discharge timing synchronized with a repetition frequency;
- an amplifier configured to amplify the pulse laser light by exciting, with a charge voltage at a second discharge timing, a laser medium through which the pulse laser light passes; and
- a processor configured to provide a command on the charge voltage to the amplifier based on a charge voltage command value provided from an exposure apparatus, set the second discharge timing by adding a delay time to the first discharge timing, and perform a process of changing the delay time and a process of correcting the charge voltage command value in accordance with a change of the repetition frequency.

* * * * *